US007699138B2

(12) United States Patent
Struthers et al.

(10) Patent No.: US 7,699,138 B2
(45) Date of Patent: Apr. 20, 2010

(54) DEVICES AND METHODS FOR FLANGELESS INSTALLATIONS

(75) Inventors: Scott Struthers, San Clemente, CA (US); Ray Call, Mission Viejo, CA (US); Todd Ryan, Riverside, CA (US)

(73) Assignee: Dana Innovations, San Clemente, CA (US)

( * ) Notice: Subject to any disclaimer, the term of this patent is extended or adjusted under 35 U.S.C. 154(b) by 176 days.

(21) Appl. No.: 11/566,365

(22) Filed: Dec. 4, 2006

(65) Prior Publication Data

US 2008/0075297 A1 Mar. 27, 2008

Related U.S. Application Data

(63) Continuation of application No. 11/548,381, filed on Oct. 11, 2006.

(60) Provisional application No. 60/825,162, filed on Sep. 11, 2006.

(51) Int. Cl.
*H05K 5/00* (2006.01)

(52) U.S. Cl. ....................................... 181/150; 181/148

(58) Field of Classification Search ................. 181/250, 181/150; 381/86, 387; 52/205, 220.8, 204.1, 52/742.11, 206, 745.16; 248/200, 220.21, 248/205.1, 300
See application file for complete search history.

(56) References Cited

U.S. PATENT DOCUMENTS

| | | | | |
|---|---|---|---|---|
| 3,636,281 | A | 1/1972 | Cozard | |
| 3,777,844 | A | 12/1973 | Johnson | |
| 3,848,090 | A | 11/1974 | Walker | |
| 3,912,865 | A * | 10/1975 | Seebinger | 381/124 |
| 4,077,169 | A * | 3/1978 | Thaw et al. | 52/745.09 |
| 4,133,097 | A | 1/1979 | Slade | |
| 4,296,280 | A | 10/1981 | Richie | |
| 4,576,431 | A * | 3/1986 | Thayer | 439/560 |
| 4,763,307 | A | 8/1988 | Massa | |
| 4,778,134 | A * | 10/1988 | Struthers et al. | 248/27.1 |
| 4,903,300 | A | 2/1990 | Polk | |
| 4,910,937 | A * | 3/1990 | Sperling | 52/511 |
| 4,923,032 | A * | 5/1990 | Nuernberger | 181/150 |
| RE33,305 | E * | 8/1990 | Thayer | 439/560 |
| 4,970,836 | A * | 11/1990 | Brown | 52/205 |

(Continued)

FOREIGN PATENT DOCUMENTS

EP 0422322 A2 4/1991

(Continued)

*Primary Examiner*—Jeffrey Donels
*Assistant Examiner*—Forrest M Phillips
(74) *Attorney, Agent, or Firm*—Fish & Associates, PC

(57) ABSTRACT

A flangeless mounting system, suitable for in-wall speakers and other objects, includes a panel that replaces a substantial section of wallboard instead of being installed behind the wallboard. In preferred embodiments a rim extends outwardly from a first surface of the panel by a distance of less than ½ inch, and preferably by only ⅛ inch or even 1/16 inch. The face of the object can be quite large, up to 40 $in^2$ or more, and still be relatively small with respect to the panel. Panels are contemplated that have a width at least two, three or more times that of the face of the object, and along with optional wings are wider than the stud separation in the wall.

16 Claims, 4 Drawing Sheets

U.S. PATENT DOCUMENTS

| | | | | | |
|---|---|---|---|---|---|
| 4,974,698 | A | | 12/1990 | Smith | |
| 5,005,792 | A | * | 4/1991 | Rinderer | 248/205.1 |
| 5,082,083 | A | | 1/1992 | Draffen | |
| 5,096,439 | A | * | 3/1992 | Arnett | 439/536 |
| 5,221,069 | A | * | 6/1993 | Struthers et al. | 248/231.9 |
| 5,263,676 | A | * | 11/1993 | Medlin et al. | 248/300 |
| 5,269,861 | A | * | 12/1993 | Gilbreath | 156/98 |
| 5,277,013 | A | | 1/1994 | Gilbert | |
| 5,292,092 | A | * | 3/1994 | Curtis et al. | 248/27.1 |
| 5,310,149 | A | | 5/1994 | Struthers et al. | |
| 5,330,144 | A | | 7/1994 | Stevenson et al. | |
| 5,333,148 | A | | 7/1994 | Tsubaki et al. | |
| 5,388,795 | A | * | 2/1995 | Struthers et al. | 248/231.9 |
| 5,423,500 | A | * | 6/1995 | Struthers et al. | 248/27.1 |
| 5,574,796 | A | | 11/1996 | Keezer | |
| 5,598,480 | A | | 1/1997 | Kim | |
| 5,598,670 | A | * | 2/1997 | Humphrey et al. | 52/220.8 |
| 5,687,532 | A | * | 11/1997 | Torrey | 52/656.3 |
| 5,717,171 | A | | 2/1998 | Miller et al. | |
| 5,730,409 | A | | 3/1998 | Baron et al. | |
| 5,867,583 | A | | 2/1999 | Hazelwood et al. | |
| 6,056,083 | A | | 5/2000 | Daniell | |
| 6,070,383 | A | * | 6/2000 | Jeanseau | 52/506.05 |
| 6,098,743 | A | | 8/2000 | McGrath | |
| 6,125,608 | A | | 10/2000 | Charlson | |
| 6,202,377 | B1 | * | 3/2001 | Krieger | 52/489.1 |
| 6,215,885 | B1 | | 4/2001 | Geiger | |
| 6,266,250 | B1 | | 7/2001 | Foye | |
| 6,268,563 | B1 | * | 7/2001 | Gretz | 174/53 |
| 6,307,947 | B1 | | 10/2001 | Wiener | |
| 6,355,882 | B1 | * | 3/2002 | Gretz | 174/53 |
| 6,364,053 | B1 | | 4/2002 | Huerth | |
| 6,405,983 | B1 | * | 6/2002 | Goj | 248/205.1 |
| 6,596,938 | B2 | * | 7/2003 | Gilleran | 174/58 |
| 6,807,780 | B2 | * | 10/2004 | McCahill et al. | 52/220.8 |
| 6,845,840 | B2 | | 1/2005 | Cowan et al. | |
| 6,896,833 | B2 | | 5/2005 | Chadwick | |
| 6,913,369 | B2 | | 7/2005 | Chadwick | |
| 7,003,129 | B2 | | 2/2006 | Hecht | |
| 7,032,708 | B2 | | 4/2006 | Popken | |
| 7,108,394 | B1 | | 9/2006 | Swarens | |
| 7,176,377 | B1 | * | 2/2007 | Gretz | 174/58 |
| 7,292,702 | B2 | * | 11/2007 | Hagman | 381/345 |
| 7,303,802 | B1 | * | 12/2007 | Brower et al. | 428/63 |
| 7,316,835 | B1 | * | 1/2008 | Swanson | 428/63 |
| 7,353,907 | B2 | * | 4/2008 | Whitaker | 181/150 |
| 7,363,720 | B2 | * | 4/2008 | DiGavero et al. | 33/528 |
| 2002/0055301 | A1 | * | 5/2002 | Gorman | 439/535 |
| 2002/0125031 | A1 | * | 9/2002 | Gilleran | 174/58 |
| 2002/0162702 | A1 | | 11/2002 | Kramer | |
| 2002/0184845 | A1 | * | 12/2002 | Horowitz | 52/489.2 |
| 2003/0042371 | A1 | * | 3/2003 | McCahill et al. | 248/57 |
| 2003/0110718 | A1 | * | 6/2003 | Boisvert | 52/208 |
| 2003/0116341 | A1 | * | 6/2003 | Gilleran | 174/58 |
| 2003/0123679 | A1 | | 7/2003 | Dudleston et al. | |
| 2003/0155473 | A1 | * | 8/2003 | Rivera et al. | 248/205.1 |
| 2003/0159390 | A1 | * | 8/2003 | Fonseca | 52/408 |
| 2004/0129492 | A1 | * | 7/2004 | Bertagni et al. | 181/150 |
| 2004/0218777 | A1 | * | 11/2004 | Hagman | 381/386 |
| 2005/0094362 | A1 | | 5/2005 | Stephens | |
| 2005/0201571 | A1 | | 9/2005 | Saint-Vincent et al. | |
| 2005/0252673 | A1 | * | 11/2005 | Kregle et al. | 174/58 |
| 2006/0059829 | A1 | * | 3/2006 | Flynn | 52/514 |
| 2007/0051862 | A1 | | 3/2007 | Monti | |
| 2007/0121988 | A1 | * | 5/2007 | Merrey et al. | 381/386 |
| 2008/0110672 | A1 | * | 5/2008 | Ryan | 174/542 |
| 2008/0115446 | A1 | * | 5/2008 | Brinkley | 52/653.1 |

FOREIGN PATENT DOCUMENTS

| | | | |
|---|---|---|---|
| EP | 0422322 | A3 | 4/1991 |
| EP | 0422322 | B1 | 7/1994 |
| EP | 0422322 | B1 | 7/1994 |
| WO | WO 01/65897 | A1 | 9/2001 |
| WO | 01/065897 | | 9/2002 |

* cited by examiner

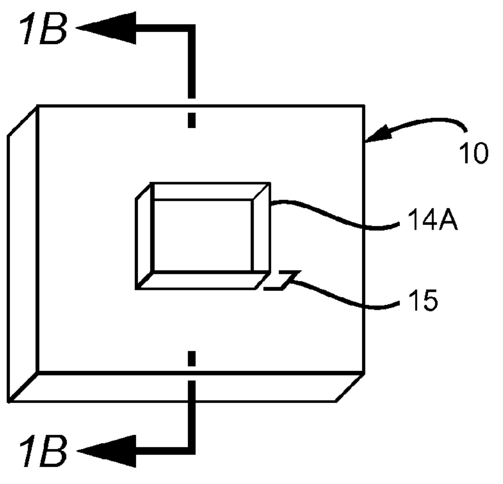
FIG. 1A
PRIOR ART
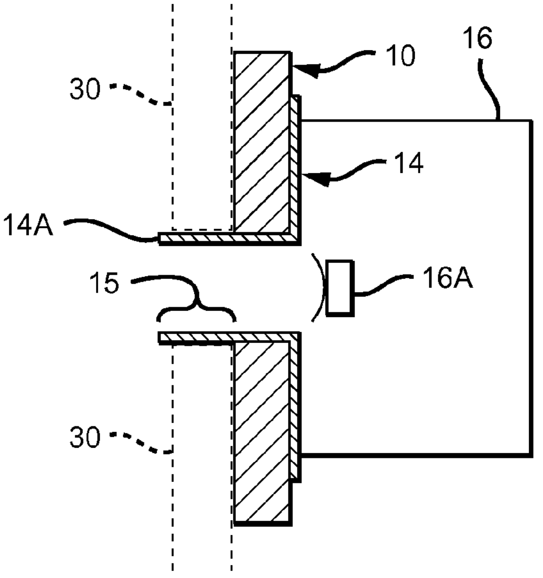
FIG. 1B
PRIOR ART
FIG. 2
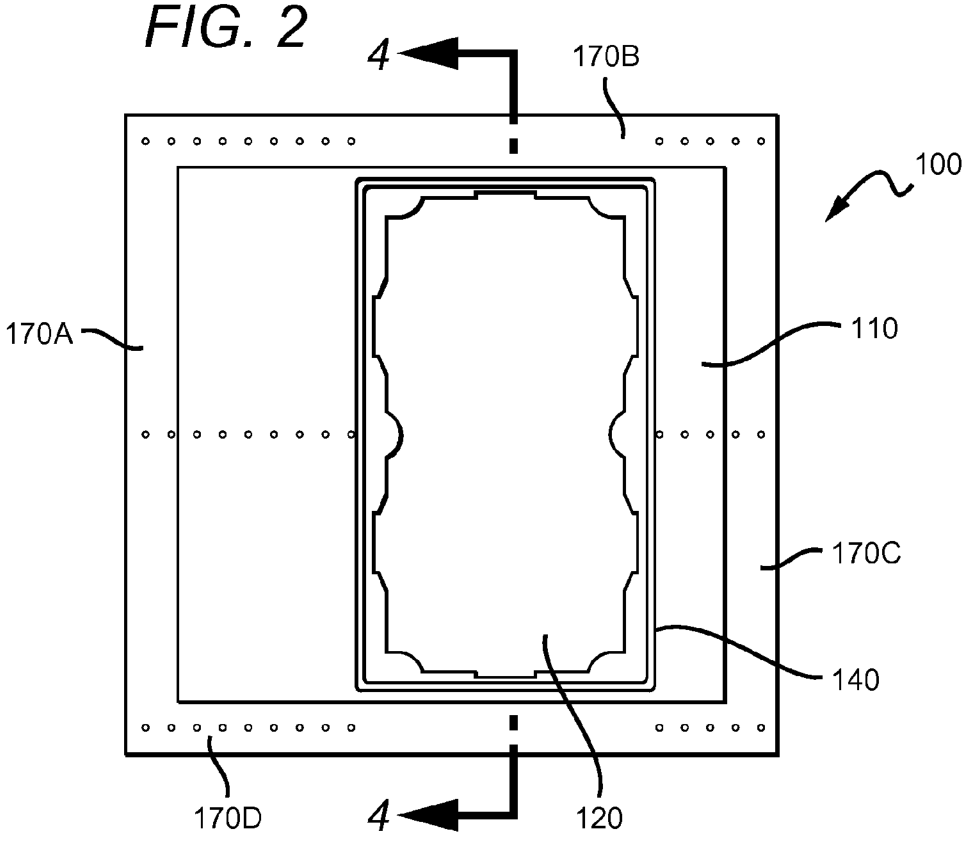

FIG. 3
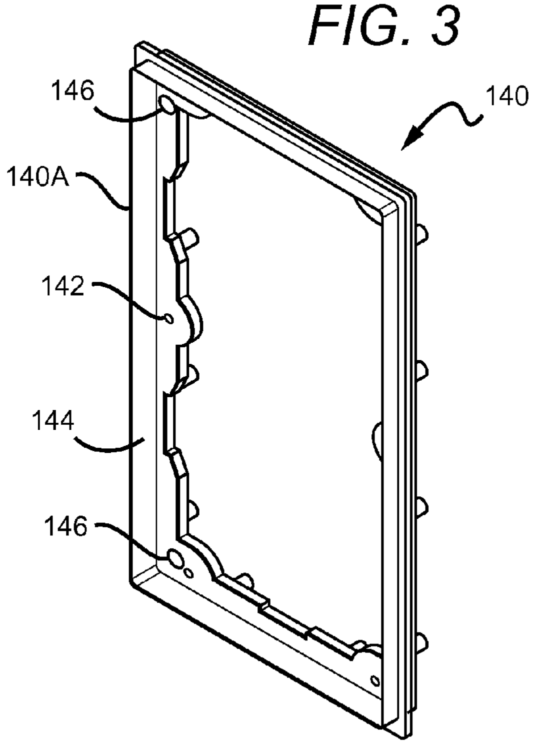
FIG. 4
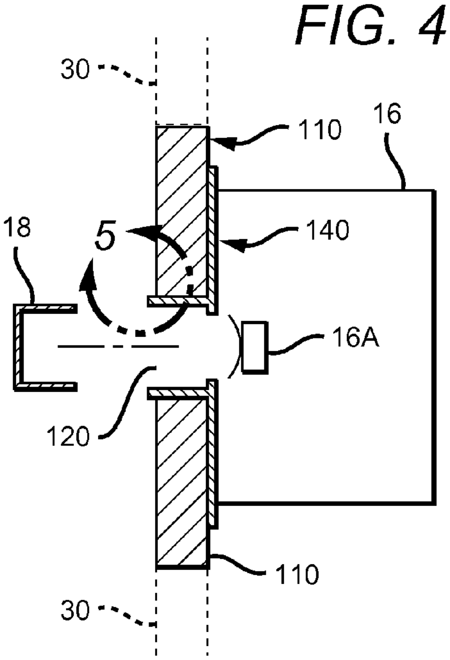
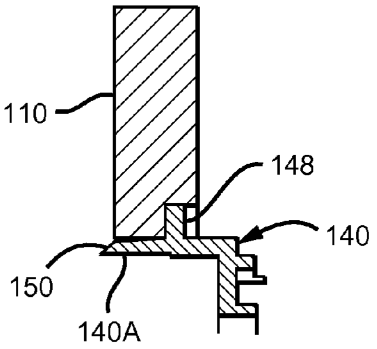
FIG. 5
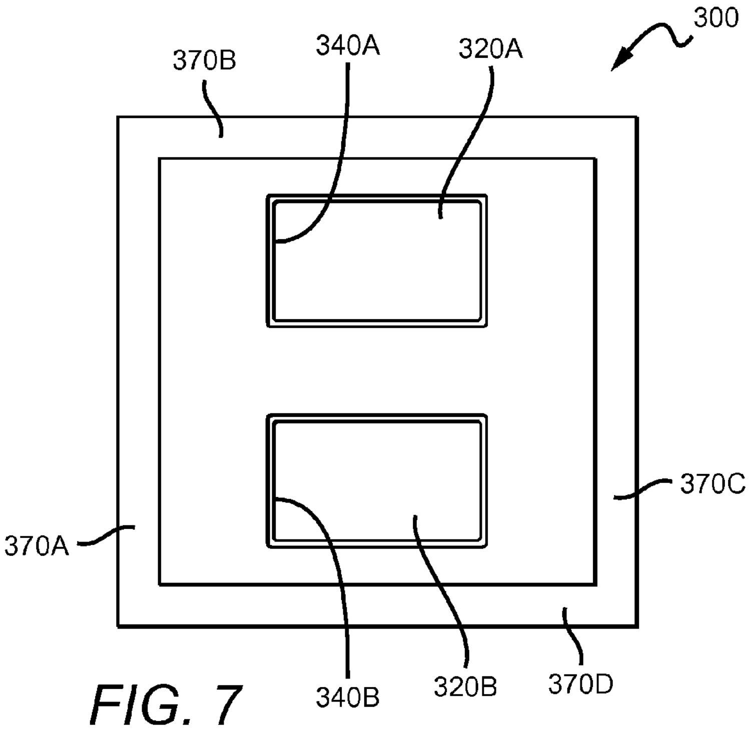
FIG. 7

DEVICES AND METHODS FOR FLANGELESS INSTALLATIONS

This continuation application claims the benefit of U.S. application Ser. No. 11/548,381, filed Oct. 11, 2006 incorporated herein by reference in its entirety.

FIELD OF THE INVENTION

The field of the invention is wall mounted speakers and other items.

BACKGROUND

Speakers, plasma screens, and other objects are traditionally mounted to a wall in one of two ways. One method uses a bracket that surrounds a cutout in the wallboard. The bracket typically has a flange that overlays the front surface of the wallboard, and extends away from the cutout on the top, bottom, and sides. A decorative cover is then used to hide the flange. In a more modern version shown in U.S. Pat. No. 7,003,129 to Hecht (February 2006), the flange is itself decorative, which obviates the need for a separate cover. The other traditional method of mounting an object to a wall is to extend the object housing from the front side of the wallboard. An example of that approach is the surface mounted loudspeaker and bracket of U.S. Pat. No. 6,845,840 to Cowan et al. (January 2005).

The '129 and '840 patents, and all other referenced extrinsic materials are incorporated herein by reference in their entirety. Where a definition or use of a term in an incorporated reference is inconsistent or contrary to the definition of that term provided herein, the definition of that term provided herein applies and the definition of that term in the reference does not apply.

A much more recent development is flush mounting of wall mounted objects, which to some individuals provides a more desirable appearance. Flush mounting is accomplished by cutting a hole in the wall board, inserting a bracket having a rim that approximates the thickness of the wallboard, and then spackling up to the edge of the rim. In prior art FIGS. 1A and 1B, for example, a panel 10 is placed behind the wallboard 30. The speaker housing 16 extends out the back side of the panel 10 (i.e. inside the wall), and a bracket 14 coupled to the panel 10 has a rim portion 14A that extends above the panel 10 by a distance 15. The installer then spackles along the front side of the wallboard 30 up to the edge of the rim 14.

Unfortunately, the current flush mounting techniques have several drawbacks. One drawback is that they can be extremely difficult to install in an already finished wall. Since the wallboard juxtaposes the rim portion of the bracket, any defect in size or positioning of the bracket can be readily observed without considerable skill during the spackling stage. Even in a new construction situation, the fact that the critical taping and spackling is performed right at the connection between the wallboard and the rim, means that the defect is readily apparent to even a casual observer. A third drawback is that positioning of the panel behind the wallboard reduces what may be already very limited space for the speaker.

Thus, there is still a need for flush-mount speaker systems and methods that facilitate installation, and provide greater room for a speaker housing.

SUMMARY OF THE INVENTION

The present invention provides apparatus, systems and methods for flangeless speaker and other object mounts, in which the joints between the object panel and the wallboard are placed at a distance from the speaker opening.

In preferred embodiments the opening has a rim that extends outwardly from a first surface of the panel by a distance of less than ½ inch, and preferably by only ⅛ inch or even 1⁄16 inch. The openings can be quite large, ranging from 20 $in^2$ up to 40 $in^2$, 80 $in^2$, or more, but are preferably still relatively small with respect to the panel and preferably no more than half of a length of the panel. Panels are contemplated that have a width at least two, three or more times that of the opening, and along with optional wings are wider than the stud separation in the wall. It is also contemplated that panel has multiple openings, preferably two openings and one opening with an area of at least 20 $in^2$. Panel has a preferred thickness of ¼ inch.

The rim is preferably part of a bracket installed in the opening, the bracket further comprising a holding mechanism capable of removably retaining a grille in the opening. All suitable holding mechanisms are contemplated, including magnetic and press fit.

Preferred methods of mounting a speaker or other object in a wall, comprise: providing a panel having a front side, a back side and at least one edge, and an opening between the front and back sides through which sound from the object can pass; optionally installing a rim that extends from the front side of the pane, and is disposed about at least a portion of the opening; optionally installing a spackle shield in the opening; optionally mounting the object housing to the back side of the panel; mounting the panel to at least one support member of the wall; and positioning the at least one edge of the panel so that it can be approximated in an end-to-end fashion by an edge of a piece of wallboard or other wall section.

Various objects, features, aspects and advantages of the present invention will become more apparent from the following detailed description of preferred embodiments of the invention, along with the accompanying drawings in which like numerals represent like components.

BRIEF DESCRIPTION OF THE DRAWING

FIG. 1A is a front perspective view of a prior art flush mount speaker panel.

FIG. 1B is a vertical cross-section of the prior art speaker panel taken along line 1B-1B in FIG. 1A, installed in a wall and with an attached speaker.

FIG. 2 is a plan view of a panel having a sound opening, and a bracket disposed in the sound opening.

FIG. 3 is a front perspective view of the bracket in FIG. 2.

FIG. 4 is a simplified vertical cross-section of the panel and bracket of FIG. 2, taken along line 4-4, installed in a wall and with an attached speaker.

FIG. 5 is a blow up of the circled portion of FIG. 4.

FIG. 7 is a front perspective view of a panel having two speaker openings.

DETAILED DESCRIPTION

Figure 6A:
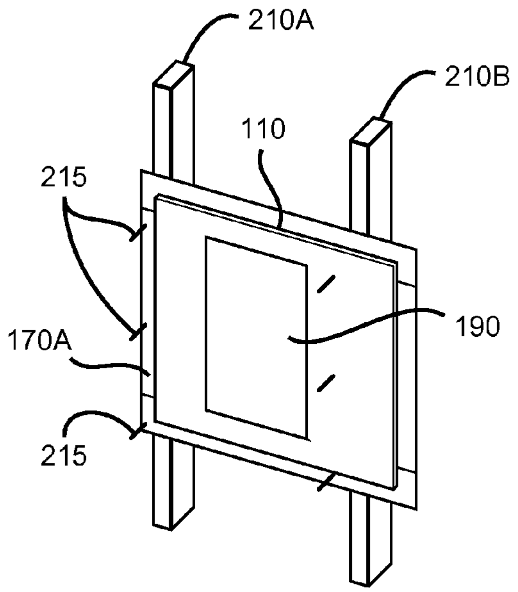
FIG. 6A is a front perspective view of a panel being affixed to two studs in a wall, the panel having a spackle shield covering an opening.

In FIG. 2 a speaker mounting apparatus 100 generally includes a panel 110 with an opening 120, a bracket 140 disposed in the opening 120, and attachment wings 170A-170D. It should be appreciated that a speaker is used in these figures as an example of a wall mounted object. The same or analogous principles disclosed herein apply to plasma screens, in wall art panels, in wall cabinets or display areas, windows, and so forth.

Panel 110 is a piece of wood, plastic, or other material sufficiently strong to support a speaker between two studs of a wall. Where plywood is used, for example, the panel might be as thin as ¼", but would more preferably measure at least ½" or ⅜". Preferred material include Medium Density Fiberboard (MDF), Acrylonitrile Butadiene Styrene (ABS), and other materials that closely match various characteristics of drywall. Panel 110 can have any other suitable dimensions, even for example, up to the size of replacing an entire sheet of wallboard. It is preferable for the panel 110, or at least the lateral wings 120A, 120C to have a width at least six or twelve inches greater than the spacing between studs. The extra width allows the installer considerably greater flexibility in positioning the panel on the wall.

As used herein the term "wall" should be construed broadly to mean any sort of mechanical barrier to which a speaker or similar sized and weighted object could be attached. Thus, the term "wall" includes walls of buildings, machine housings, automobiles, cabinets and so forth, as well as doors and ceilings. Along the same lines, the term "wall section" should be interpreted as any modular portion of the wall. In standard home construction, for example, a wall section would likely be a piece of wallboard.

The opening 120 can also be any suitable shape and size. Preferred openings are rectangular to accommodate rectangular shaped speaker housings, but could also be oval and circular or any other desired shape. The area of the opening is generally dependent on the size of the speaker, and can range up to 80 $in^2$, or larger. Especially preferred openings have an area of at least 20 $in^2$, 40 $in^2$, 60 $in^2$, and even 80 $in^2$. Nevertheless, for stability, it is contemplated that the panel have an opening with a length that is no more than half or one third the length of the panel. In some cases it may be desirable to include multiple openings to accommodate multiple speakers, as in FIG. 7. Preferred embodiments with multiple openings provides at least two openings and at least one of which has an area of at least 20 $in^2$.

Any opening can be positioned in any suitable arrangement relative to the panel 110, and indeed FIG. 2 shows an embodiment where the opening 120 is laterally off center with respect to the opening. Openings could be cut at a job site or elsewhere by an installer, but are more conveniently precut (or molded to include the opening) at the manufacturer. It is possible for a panel to have punch out openings or perhaps cutout lines to facilitate selection of the position of the opening at the job site, but those options are currently disfavored relative to a manufactured opening and a relatively large panel.

The top, bottom, and side wings 170A-170D, respectively, preferably extend from the corresponding edges of the panel 110 by at least about one inch, which is deemed to be sufficient space to conveniently drive a nail or screw into a stud. It is also contemplated, however, that at least one of the wings 170A-170D can extend much longer, perhaps 24 to 30 inches or more. Such long wings can accommodate odd installations where the studs are spread apart at a greater distance from each other than normal. Wings 170A-170D are preferably made of a metal mesh, but can include of any suitable material or materials so long as the material(s) provide(s) sufficient shear strength to support the panel 110 and speaker 16. Metal mesh is also desirable because the wings are advantageously relatively thin, so as not to push out the overlying wallboard, and metals can provide considerable strength with thickness of less than 100 mils. It should also be appreciated that although wings 170A-170D are described herein by separate numerals, they may well be one continuous piece of material.

Bracket 140 is preferably sized and dimensioned to fit snugly into the opening 120, but in any event is screwed or otherwise securely attached to the panel 110. The secure attachment is important since in at least some embodiments, the speaker housing will be attached to the bracket 140 rather than being attached directly to the panel 110. Bracket 140 is preferably molded from polyethylene or other sufficiently strong and durable thermoset plastic, and as shown in greater detail in FIG. 3 bracket 140 includes holes 142 for screws (not shown), a recess 144 into which a speaker grille 18 can be removably secured via a holding mechanism, and a rim 140A, and optional magnets 146 or an optional press fit (not shown).

FIG. 4 also shows a speaker 16A and a grille 18. Speaker 16A should be interpreted as generically representing all practical speakers, including especially dynamic loudspeakers, but also including speakers without moving coils (e.g. piezoelectric speakers, plasma arc loudspeakers, digital speakers, and electrostatic loudspeakers (ESL)). The various wires for power and signal are not show in the Figures, but should be assumed, and can be those conventionally contemplated in the art. Grille 18 can be any suitable speaker grille, but is preferably a metallic mesh grille that press-fits into the opening 120. Additionally or alternatively, the bracket can include a ferrous material that is attracted to magnets 146 in bracket 140.

It should also be appreciated that the same technology can also be used to support items other than speakers, such as windows, planters, alcoves and so forth.

As seen in FIG. 5 the rim 140A is sized and dimensioned to extend outwardly from the panel 110 by a very small distance 150, which provides a lip that can readily be filled with spackle. Preferred such distances 150 are less than ⅛ inch, and preferably about 1/16 inch. The height 150 of rim 140A above the panel 110 is thus very different from the height 15 of rim 14A above the panel 10 in FIG. 1B. In the prior art configuration the rim 14A extends by more than the combined thickness of the panel 10 and the wallboard 30. Preferably, the panel has a thickness of at least ¼ inch. Also shown in FIG. 5 is an attachment member 148 that helps secure bracket 140 to panel 110.

It should also be appreciated that the rim could be separable from the panel. Thus, for example, the rim could be a separately molded piece of plastic, metal or composite that is installed into the opening by the installer, or at a factory.

In FIG. 6A the panel 110 is affixed to two studs 210A, 210B in a wall, and screws 215 are inserted through one of the wings 170A and the panel 110. Of course, the positioning and orientation of the panel could be varied in any suitable manner with respect to the studs, 210A, 210B, including moving the panel 110 higher or lower, left or right, or even tilting the panel clockwise or counterclockwise. Similarly, the studs should be interpreted herein as emblematic of any support structures of a wall, whether or not such structures are technically considered to be studs. In addition, a greater or lesser number of screws could be used, or inserted in some other arrangement than that shown to provide greater or lesser support. The screws could also be replaced or supplemented by some other attachment means such as adhesive. In preparation for spackling, a spackle shield 190 covers the opening 120.

Those skilled in the art will appreciate that the combination of panel and bracket could be provided in several different ways. The panel and bracket could, for example, be joined together at a job site, and indeed the panel could even be "manufactured" at the job site by cutting or punching out the opening. More preferably, however, the panel and bracket are provided as an item of manufacture to the installer by a supplier or manufacturer. The rim of the panel can be pre-installed to the panel. Thus, in various embodiments a kit could contain one or more of a panel, a bracket (or at least a rim around the edges of an opening in the panel), a speaker housing, a spackle shield, and installation screws. The installer would then provide whatever labor is appropriate for the installation, including optionally installing the bracket and/or rim, optionally installing the spackle shield, and optionally mounting the speaker into the speaker housing to the back side of the panel. It is also contemplated that the speaker can be pre-installed into the panel before installation. Alternatively the combination of the panel and bracket can be mounted before installing a rim on the opening.

Figure 6B:
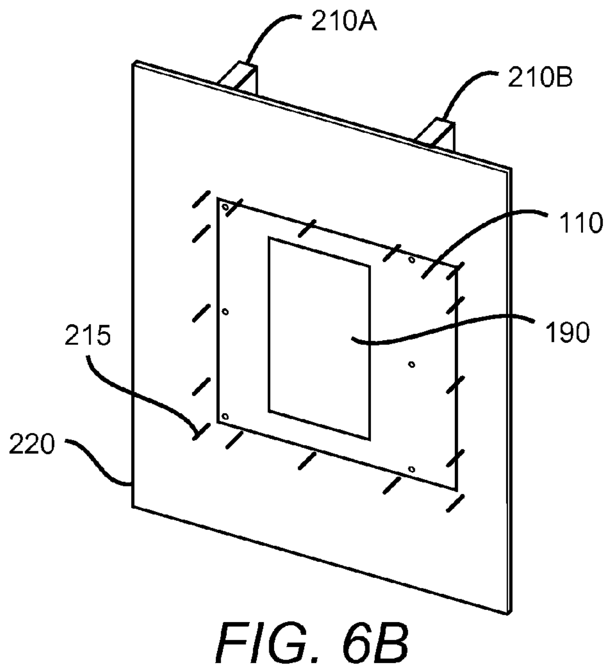
FIG. 6B is a front perspective view of the panel of FIG. 4A, around which drywall has been installed.

In FIG. 6B drywall 220 or other wallboard has been installed on all four sides around the panel 110, and coupled to the wings using screws 215. Where wings are present, as in the embodiment depicted, the drywall 220 overlays the wings, but the wings are sufficiently thin so that the drywall is not noticeable raised. Those skilled in the art will appreciate that although FIG. 6B shows the drywall 220 surrounding the panel 110 as a single piece, it is entirely possible that the drywall could comprise multiple pieces (not shown). It is also contemplated that installation of the drywall 220 might be delegated to drywaller or other tradesman distinct from the panel installer. Nevertheless, the process of installing the panel on one or more wall supports is deemed to include the step of positioning the panel so that it can be approximated in an end-to-end fashion by a piece of wallboard or other wall section.

Figure 6C:
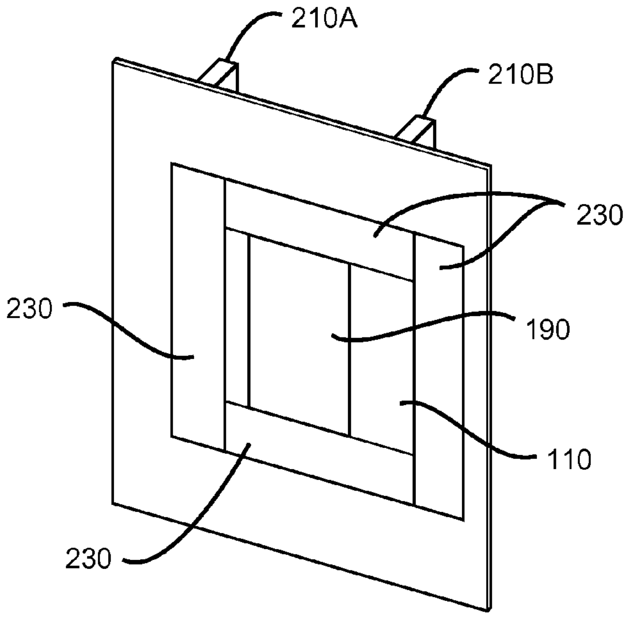
FIG. 6C is a front perspective view of the panel and drywall of FIG. 4B, showing mesh tape.

In FIG. 6C mesh tape 230 is applied along the juxtapositions or other approximations between edges of the panel 110 and edges of the drywall 220. Here again, this step is usually delegated to a professional drywaller, but should be interpreted as being accomplished by the installer of the panel, regardless of which person actually does the work.

Figure 6D:
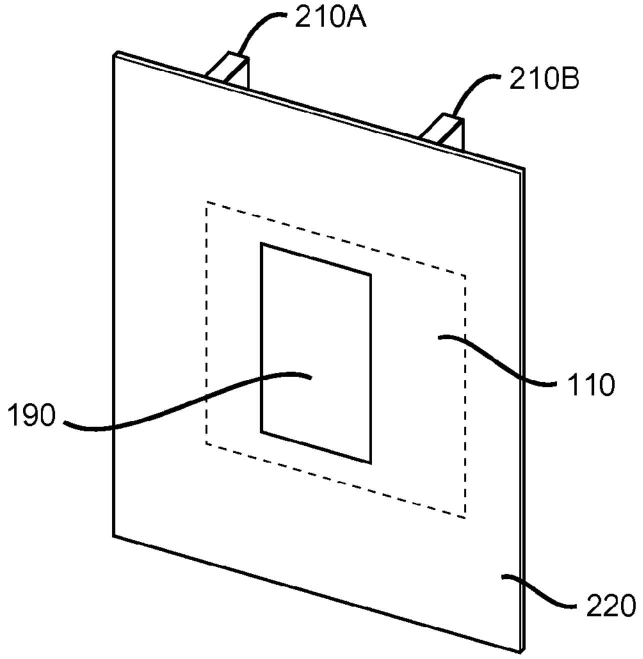
FIG. 6D is a front perspective view of the panel and drywall of FIG. 4C, where the mesh tape has been covered by spackle.

In FIG. 6D the mesh tape is covered by spackle, and ready for painting, wallpapering, or other surface coating. As used herein, the terms "spackle" and "spackling" should be interpreted as broadly as possible, to include for example plaster and plastering of any type. The point is merely to provide a smoothed out surface that completely or substantially hides the joints between edges of the panel and edges of the drywall.

Figure 6E:
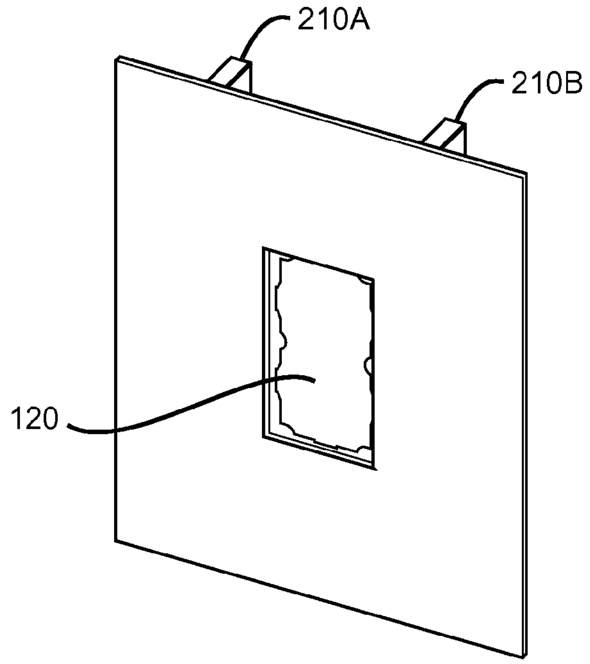
FIG. 6E is a front perspective view of the panel and drywall of FIG. 4C, where the spackle shield has been removed to show the opening.

In FIG. 6E the spackle shield is removed to show the opening 120. Note that for simplicity the speaker housing is not shown in the Figure. Nevertheless, the speaker housing would almost certainly have been installed, and the various power and signal cables connected, prior to fixing the panel 110 on the studs 210A, 210B.

In FIG. 7 a panel 300 has two speaker openings 320A and 320B. These openings are each preferably at least 40 $inch^2$ in area, but can be any sizes or shapes, and can have any physically orientation and positioning with respect to each other. The openings 320A, 320B have brackets 340A, 340B, respectively, the panel 300 has wings 370A-370D, all in accordance with the teaching herein.

Thus, specific embodiments and applications of flangeless speaker devices and methods have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. A device for facilitating installation of a device in a wall having a wallboard supported from behind by at least first and second supporting members, comprising:

a panel sized and dimensioned to be approximated in an end-to-end fashion with the wallboard;

an opening defined by the panel, wherein the panel has a remaining front facing surface area of at least 25 $in^2$;

a first attachment means that couples the panel to the first supporting member;

a second attachment means that couples the panel to the wallboard; and a spackle rim disposed about the opening, and extending outwardly from a first surface of the panel by a distance of less than ¼ inch.

2. The device of claim 1, wherein the opening has a length that is no more than half a length of the panel.

3. The device of claim 1, wherein the front facing surface area is at least 3 times a front facing area of the opening.

4. The device of claim 1 wherein the front facing surface area is at least 5 times a front facing area of the opening.

5. The device of claim 1 wherein the opening has a front facing surface area of 20-40 $in^2$.

6. The device of claim 1 wherein the opening has a front facing surface area of 40-80 $in^2$.

7. The device of claim 1 wherein the rim extends outwardly from the first surface by no more than ⅛ in.

8. The device of claim 1 further comprising a bracket supported by the panel at the opening.

9. The device of claim 7 wherein the bracket is sized and dimensioned to receive a light switch.

10. The device of claim 7 wherein the bracket is sized and dimensioned to receive an electrical outlet.

11. The device of claim 7 wherein the bracket is sized and dimensioned to receive a speaker housing.

12. The device of claim 7 wherein the bracket includes the rim.

13. The device of claim 1 wherein the panel extends at least 3 inches horizontally and vertically from the opening.

14. The device of claim 1 wherein the panel extends at least 5 inches horizontally and vertically from the opening.

15. The device of claim 1 wherein the panel comprises a material different from drywall.

16. The device of claim 1, further comprising a third attachment means that couples the panel to the second supporting member.

* * * * *